(12) United States Patent
Jeong et al.

(10) Patent No.: US 8,575,783 B2
(45) Date of Patent: Nov. 5, 2013

(54) SOLAR PANEL AS INFRARED SIGNAL RECEIVER AND PROCESSOR

(76) Inventors: Mansoon Jeong, Closter, NJ (US); Byeong Keon Son, Closter, NJ (US)

( * ) Notice: Subject to any disclaimer, the term of this patent is extended or adjusted under 35 U.S.C. 154(b) by 0 days.

(21) Appl. No.: 13/608,131

(22) Filed: Sep. 10, 2012

(65) Prior Publication Data
US 2013/0113302 A1    May 9, 2013

Related U.S. Application Data

(60) Provisional application No. 61/673,953, filed on Jul. 20, 2012.

(51) Int. Cl.
*H01L 31/00* (2006.01)
*H04B 10/00* (2013.01)

(52) U.S. Cl.
USPC .................................... 307/117; 136/243

(58) Field of Classification Search
USPC .................................... 307/117; 136/243
See application file for complete search history.

(56) References Cited

U.S. PATENT DOCUMENTS

| | | | | |
|---|---|---|---|---|
| 4,928,319 A * | 5/1990 | Pitt et al. | | 398/171 |
| 5,602,670 A * | 2/1997 | Keegan | | 398/212 |
| 6,055,079 A * | 4/2000 | Hagans et al. | | 398/111 |
| 6,586,906 B1 * | 7/2003 | Bessa et al. | | 320/101 |
| 7,813,646 B2 * | 10/2010 | Furey | | 398/140 |
| 7,941,022 B1 * | 5/2011 | Schaffner et al. | | 385/127 |
| 8,261,971 B2 * | 9/2012 | Hung et al. | | 235/375 |
| 8,344,240 B2 * | 1/2013 | Bennett et al. | | 136/251 |
| 2004/0216777 A1 * | 11/2004 | Pan | | 136/246 |
| 2006/0005876 A1 * | 1/2006 | Gaudiana et al. | | 136/251 |
| 2006/0085167 A1 * | 4/2006 | Warfield et al. | | 702/188 |
| 2013/0041516 A1 * | 2/2013 | Rockenfeller et al. | | 700/287 |

FOREIGN PATENT DOCUMENTS

JP    2012039769 A   *   2/2012

OTHER PUBLICATIONS

Leopold, Jay; "How to Turn Off a Solar Array", http://skypoweraz.com/2011/07/how-to-turn-off-a-solar-array, Accessed Jul. 20, 2012.

* cited by examiner

*Primary Examiner* — Adi Amrany
(74) *Attorney, Agent, or Firm* — Michael J. Feigin, Esq.; Feigin & Associates, LLC

(57) ABSTRACT

This invention is to control and monitor a solar module by optical communication using solar cells in the solar module as a receiver of the incoming optical signal. The optical communication is by way of solar cells in a solar module as sensors and/or receivers, and busbars of the solar module as conduits to transfer the incoming signal to a control circuitry. Such control includes, but is not limited to, on/off control of power output from a solar module, and such monitoring includes, but is not limited to, reading, data keeping and displaying current operating performance status of the solar module. With this invention, solar modules can be turned off and on without physically disconnecting and reconnecting wires. Such control and monitoring enables more efficient and accurate operation and maintenance of a solar power system of any size.

17 Claims, 6 Drawing Sheets

SOLAR PANEL AS INFRARED SIGNAL RECEIVER AND PROCESSOR

FIELD OF THE DISCLOSED TECHNOLOGY

The disclosed technology relates generally to a method for receiving coded infrared signals. More specifically, the technology relates to receiving infrared signals to a bank of solar panels and interpreting the transmitted infrared signal.

BACKGROUND OF THE DISCLOSED TECHNOLOGY

A solar cell (also called a photovoltaic cell) is an electrical device that converts light energy into electricity by the photovoltaic effect. A solar module (also solar panel, photovoltaic module or photovoltaic panel) is a packaged, connected assembly of photovoltaic cells. The solar module can be used as a component of a larger photovoltaic system to generate and supply electricity in commercial and residential applications.

In the industry, each (solar) panel is rated by its DC (direct current) output power under standard test conditions, and typically ranges from 100 to 450 watts. Because a single solar panel can produce only a limited amount of power, most installations contain multiple solar modules as part of a solar power array. A single or multiple of such arrays becomes a solar power system by being electrically connected together. A centralized control panel controls power generated by such a system, though, in the art, no system is known to the inventors which allows one to control and/or monitor an individual solar module. This becomes problematic when operators of solar power systems need to shut down power output from an individual solar module in the system for operational and/or maintenance purposes. In order to do so, currently, one must physically disconnect the wiring from a specific solar module. However, solar modules are installed very tightly to one another, so that a maximum number of solar modules can be installed in the minimum surface area. Such tight installation often makes service access very difficult.

Even more so, solar panels are often difficult to reach. In a large-scale solar system, thousands of solar modules are installed over a wide area, which makes service access to solar modules more difficult due to distance. In some cases, solar modules are installed on individual homes and buildings, though owned by a central company. In such a case, access to each solar module, panel, or set of panels requires gaining access to private property, each property owned by a different individual. Gaining physical access is tedious, sometimes impossible; however, where it is possible, it may be dangerous, depending on the nature of the home and type of access to a roof.

Another need, in the art of solar panels, is to monitor the operation of a solar panel system and individual modules therein. However, no solar modules known to the inventors provide data about each individual module. Hence, operators cannot detect which module, or know if any modules, are malfunctioning. Currently, one typically takes a module thought to be malfunctioning out of the system and tests it elsewhere.

Thus, there has been a long-felt need to allow one to diagnose individual solar modules without physically disconnecting wires. There is a further unsolved need of allowing diagnosis of solar panel performance and operating status for better operation and maintenance.

SUMMARY OF THE DISCLOSED TECHNOLOGY

The object of this invention is to enable controlling and monitoring of individual solar modules by optical communication from a distance, using solar cells in the module as signal sensor, antenna and/or receiver.

By adding a control circuitry performing signal receiving, processing and relay devices on a solar module, the invention enables multiple functions of solar module control, such as output power on/off. The invention also enables monitoring of performance and status of solar modules and displaying such monitored results so that an operator can see and understand.

In a method of the disclosed technology, solar modules are controlled and/or monitored by optical communication. This is carried out by transmitting an optical signal from a transmitter, and receiving the optical signal at at least one solar cell in a solar panel. The solar cell and solar panel concurrently are electrically connected to provide electric current to a power sink, such as a transducer of any kind, battery, light, electrical appliance, or the like. The received optical signal is propagated through busbars to a processor, the busbars being electrically engaged with the solar cell and the power sink. The received optical signal is processed to execute a command on the solar panel, such as provided output readings or statistics, or turning on/off the operation of the solar panels and/or electric current supplied to the power sink.

In embodiments of the disclosed technology, at a storage device, such as a memory storage device, electrically connected to the solar panel, power output of the solar panel is recorded. Further, the processor may be used to determine average power output over a period of time (such as a time specified by way of the optical signal, a day, a week, a month, or any other time frame), with this average power output, or a plurality of averages of different time periods, stored until it is desired to output this stored information based on a command communicated from the transmitter.

Electric current from the busbars passes through a band pass filter before passing to circuitry adapted to decode the transmitted optical signal, in an embodiment of the disclosed technology. Further, a blocking capacitor may be placed in line with the band pass filter to eliminate DC (direct current) electric current received from the busbars.

The processor may be powered by a battery and the command is stored in non-volatile memory, the command to be carried out only after the solar panel produces electrical current output above a threshold level required to execute the command. The "threshold level" is defined as having enough power (any combination of current, voltage, and resistance) to safely and predictably cause the command to be executed as fully intended by the operator or designer of the equipment being controlled, changed, or directed, by way of the command and/or transmitter.

In further embodiments of the disclosed technology, an optical transmitter and receiver kit has an optical transmitter configured to transmit coded pulses of light, such as pulses on an infrared and/or visible light spectrum. A solar panel is configured to convert light energy into electrical energy, and an electrically powered device is configured to (electrically connected to) receive the electrical energy and be operational based on the received electrical energy. At least one metal conduit between the solar panel and the electrically powered device passes current to the electrically powered device. A decoder configured to receive at least part of the electrical energy from the solar panel by way of the metal conduit detects the transmitted coded pulses of light and determines a code coded therein. A command is carried out by way of a processor receiving data from the decoder.

The solar panel may receive the transmitted coded pulses of light which is passed (as electrical energy) through a band path filter before being sent to the decoder. Operation of the electrically powered device using current received by the solar panel is simultaneous to both the receipt of the transmitted coded pulses of light and decoding thereof. "Simultaneous" is defined as having both items which are simultaneous to each other operate based on the same flow of current received by the solar panel(s).

The command, as described above, may be a "power" off command causing the electrically powered device to become non-operative, a "power on" command causing electrically connected devices to be powered, or a command to output status information about one or more electrically connected solar panels to a solar panel receiving the transmitted signal with encoded command. "Operational" is defined as carrying out intended functions which require connection to a power source, such as a battery (usually solar modules are connected to an inverter which will convert DC power to AC power and send to main circuit panel, rather than battery) with an intended function of being charged which becomes "non-operative" when it is no longer able to be charged, since the intended function in connection with the solar panels is to be charged (as opposed to another intended function of a battery to discharge, which is separate from its intended use of current passing into it from photovoltaic cells). Further, an electrically powered device might be a light with an intended electrical function of emitting light (photons), requiring electrical input from the solar panels.

Further, in embodiments of the disclosed technology, when electrical energy outputted from the solar panel is below a threshold, the command is stored in non-volatile memory until electrical output passes above a threshold at a later time. Once the threshold (as defined above) is reached, then the command is executed.

DETAILED DESCRIPTION OF EMBODIMENTS OF THE DISCLOSED TECHNOLOGY

Embodiments of the disclosed technology allow one to control and monitor a solar module by optical communication, using solar cells in the solar module as a receiver of the incoming optical signal. Once a solar cell receives an incoming optical signal, such as an infrared signal, busbars of the solar module become conduit to transfer the incoming signal to control circuitry. This control circuitry decodes the optical signal and performs an operation, such as causing the transmission of monitoring information which is received remotely, or turning on and off individual solar modules and/or an entire solar panel or array. Remotely, for purposes of the disclosed technology, is defined as received via wireless radio or infrared transmission of data or through at least one gateway of a wide area network off-site (at a different address) than the solar panel.

For purposes of this disclosure, the following definitions are used. Busbar is defined as a metal conduit which conducts electricity received by a photo-voltaic cell to power sink (Busbar is a common name of metal connection among solar cells in a solar module shown as 101. Power cable of a junction box shown as 104 is a metal wire which conducts electricity received by a photo-voltaic cell to power sink). A power sink is defined as an electricity-using (conversion of the electricity to another form of energy) or electricity-storing apparatus. Photo-voltaic is defined as the conversion of light energy to electrical energy. A photo-voltaic or solar cell is defined as a device which generates electrical energy from a light energy. A solar panel is defined as a directly electrically coupled grouping of solar cells, such coupling achieved solely with busbars. A solar array is defined as an electrically coupled grouping of solar panels, the electrical coupling between each two solar panels comprising at least a controller or power sink which is electrically connected to the different solar panels. An optical signal is defined as a coded transmission of data via light which is decoded by a receiver.

Embodiments of the disclosed technology will become clearer in view of the following description of the figures.

Figure 1B:
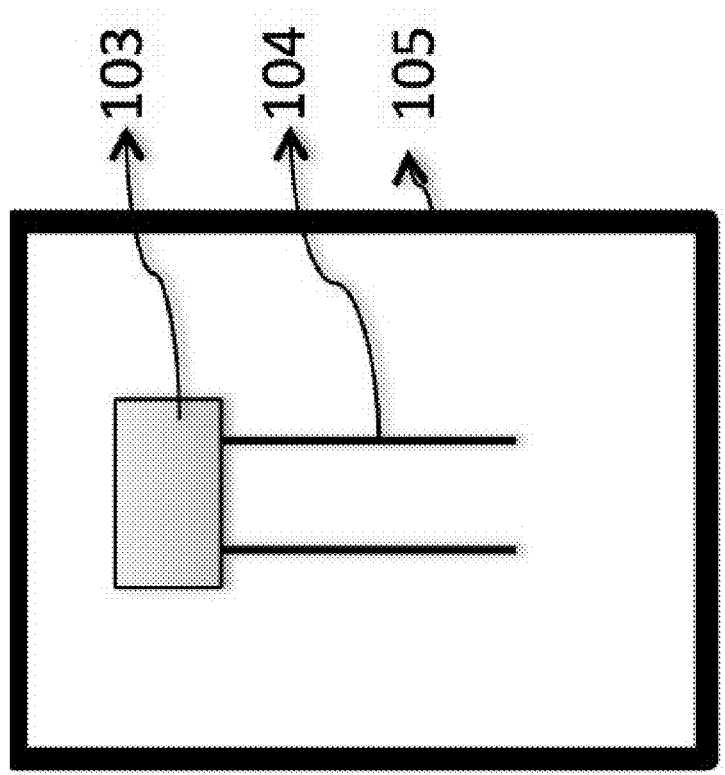
FIG. 1B shows a back side of a prior art solar module.
Figure 1A:
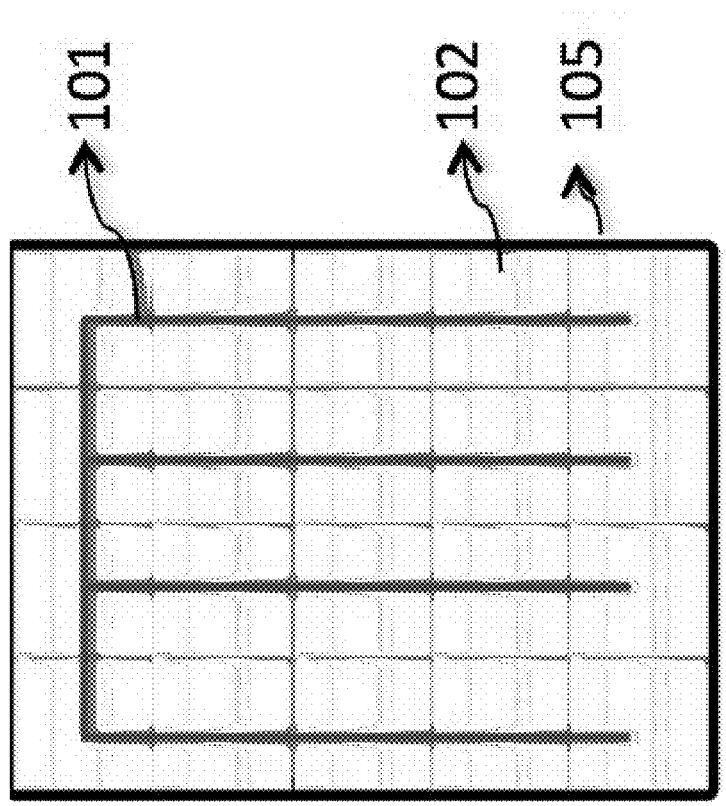
FIG. 1A shows a front side of a prior art solar module.

FIG. 1A shows a front side of a prior art solar module. FIG. 1B shows a back side of a prior art solar module. The front side is the side directed towards the sun, or which comprises a side of photovoltaic cells (or the majority thereof) capable of receiving light energy, such that the cell converts the light energy to electrical energy. Such a solar module has a busbar 101 for conducting electrical current received from solar cells 102. A junction box 103 collects the energy transmitted via the busbars, and further transmits the energy via cables 104 to other devices, such as a power sink. A frame 105 serves to physically support the solar panel.

Figure 2:
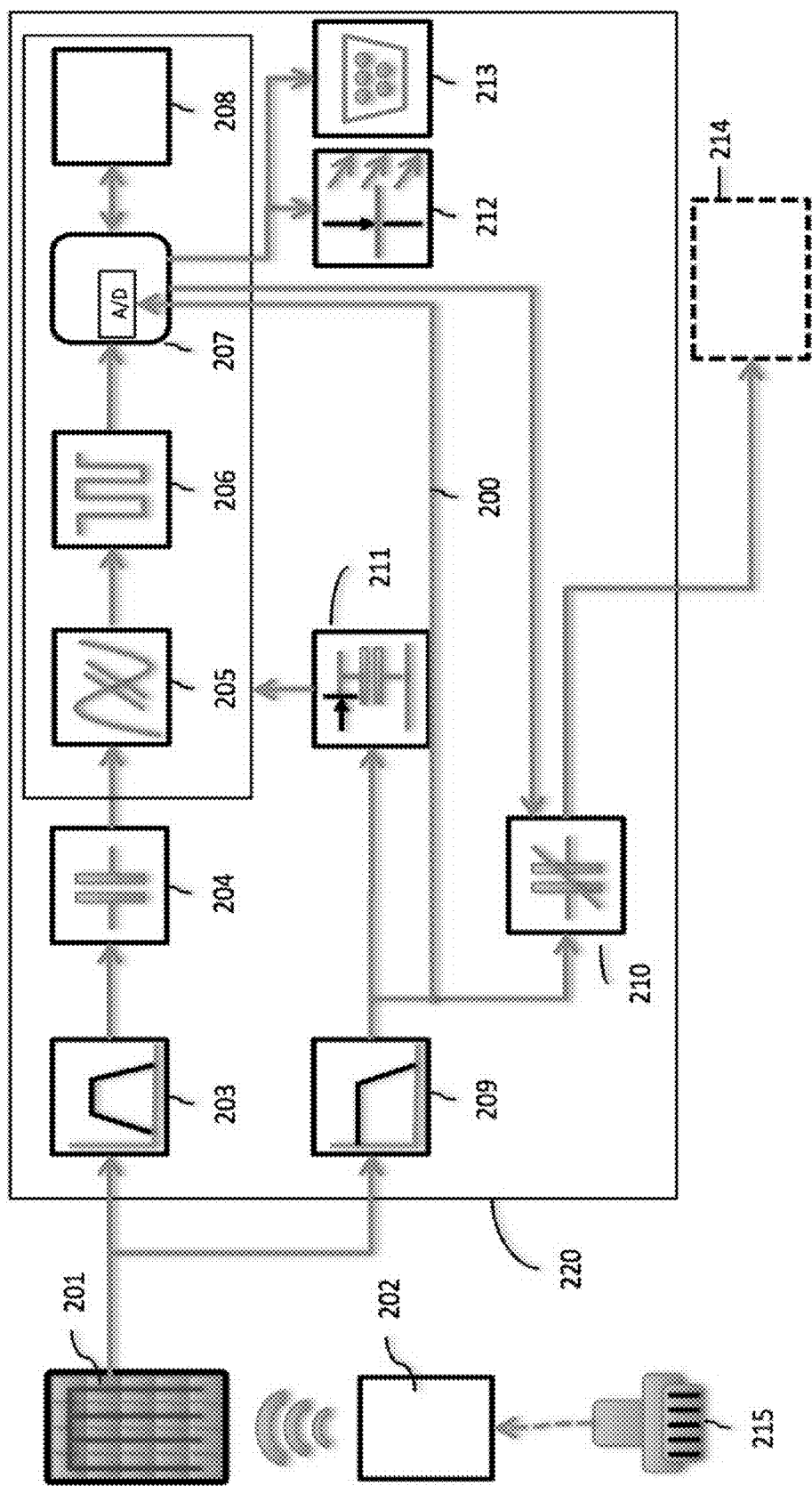
FIG. 2 is a high level block diagram of devices used to carry out embodiments of the disclosed technology.

FIG. 2 is a high level block diagram of devices used to carry out embodiments of the disclosed technology. A transmitter 202 transmits an optical signal, such as in the infrared band of light, or even, visible light, such as laser light, in a coded pattern to photo-voltaic cells 201 of a solar panel or solar array. An input device 215 is also shown which may be a computational device with processor having an output used to program or configure the transmitter 202. Similarly, a control module which is connected to a solar panel/photovoltaic cell 201 may be programmed with such an input device 215, in embodiments of the disclosed technology. Such programming may cause or allow the transmitter 202 to emit only specific control signals corresponding to a specific solar panel, array, or selected solar panels and arrays. The transmit codes may be interpreted by a controller on the receiving end as a signal, by way of example, to turn a solar module, solar array, or individual panel on or off, or receive status information from an individual solar panel, solar array, or grouping of solar arrays. The solar panel 201, after gathering the light energy transmitted by transmitter 202, passes the light energy, in the code, to control circuitry 220. This control circuitry is shown in greater detail in FIG. 3.

Figure 3:
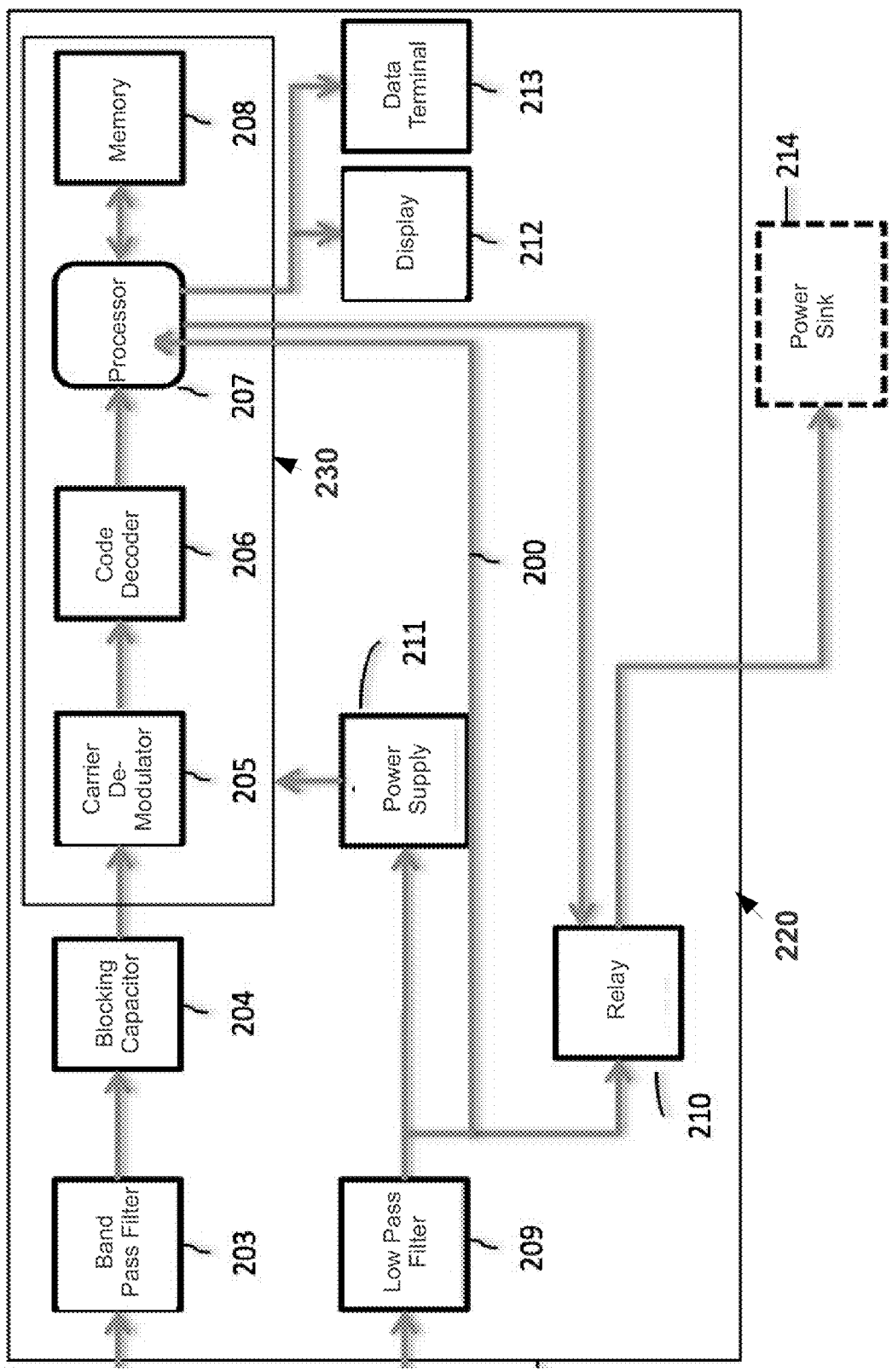
FIG. 3 is a high level block diagram of control circuitry used to carry out embodiments of the disclosed technology.

FIG. 3 is a high level block diagram of control circuitry used to carry out embodiments of the disclosed technology. (The layout of the control circuitry of FIG. 3 is the same as the layout shown in FIG. 2.) Such control circuitry 220, may be placed inside a solar module junction box (see 103 of FIG. 1), inside a solar module, or outside a solar module but electrically connected thereto. First, in embodiments of the disclosed technology, the received incoming signal is passed through a band pass filter 203 to filter received electrical signals by wavelength.

The low pass filter 209 receives/allows passage therethrough of low band current, which is the overwhelming majority of electric current received from the photo-voltaic cells. A part of the DC power passing through the low pass filter, in embodiments of the disclosed technology, charges a stand-by power supply 211. The stand-by power supply 211 is a power source or backup power source for the control circuitry 220, when the output from the solar cells is too small to power the circuitry 220. The low pass filter may also be in communication via bus 200 with a processor 207, as will be described below.

Referring back to the band pass filter 203, where the signal from the transmitter passes, a blocking capacitor 204 is then used, in line with the band pass filter 204, to eliminate DC electric current from the signal carrier which may pass through the band pass filter. Then, the incoming optical to electrical signal is processed in block 230. A carrier demodulator 205 processes the incoming signal carrier to collect encoded commands, and once the encoded commands are demodulated, a code decoder 206 processes the encoded commands and transmits them to a microprocessor 207 which conducts operations on the encoded commands and sends instructions to other devices. Such encoding and decoding enhances security of the optical communication. This may be accomplished by using data encryption algorithms in the encoding and decoding processes.

A microprocessor 207 processes the encoded signal and executes commands. The processor also measures operating status, such as current and voltage of a solar module by way of an embedded analog to digital converter and stores such data to memory, such of volatile or non-volatile memory 208 (e.g., an EEPROM (electrically Erasable/Programmable Read Only Memory). Such data may then be outputted on a display 212 or to a data terminal 213 by way of an electrical or wireless (e.g. infrared transmission or radio transmission, such as via an 802.11 network).

Referring still to FIG. 3, the relay 210 receives electricity via the low pass filter 209 and receives commands from the processor 207. The relay than either opens or closes, allowing electricity to pass through to a power sink 214 which may be another solar panel/solar array, inverter, controller, a battery for storage of energy, or a device which uses energy such as a light or appliance.

Figure 4:
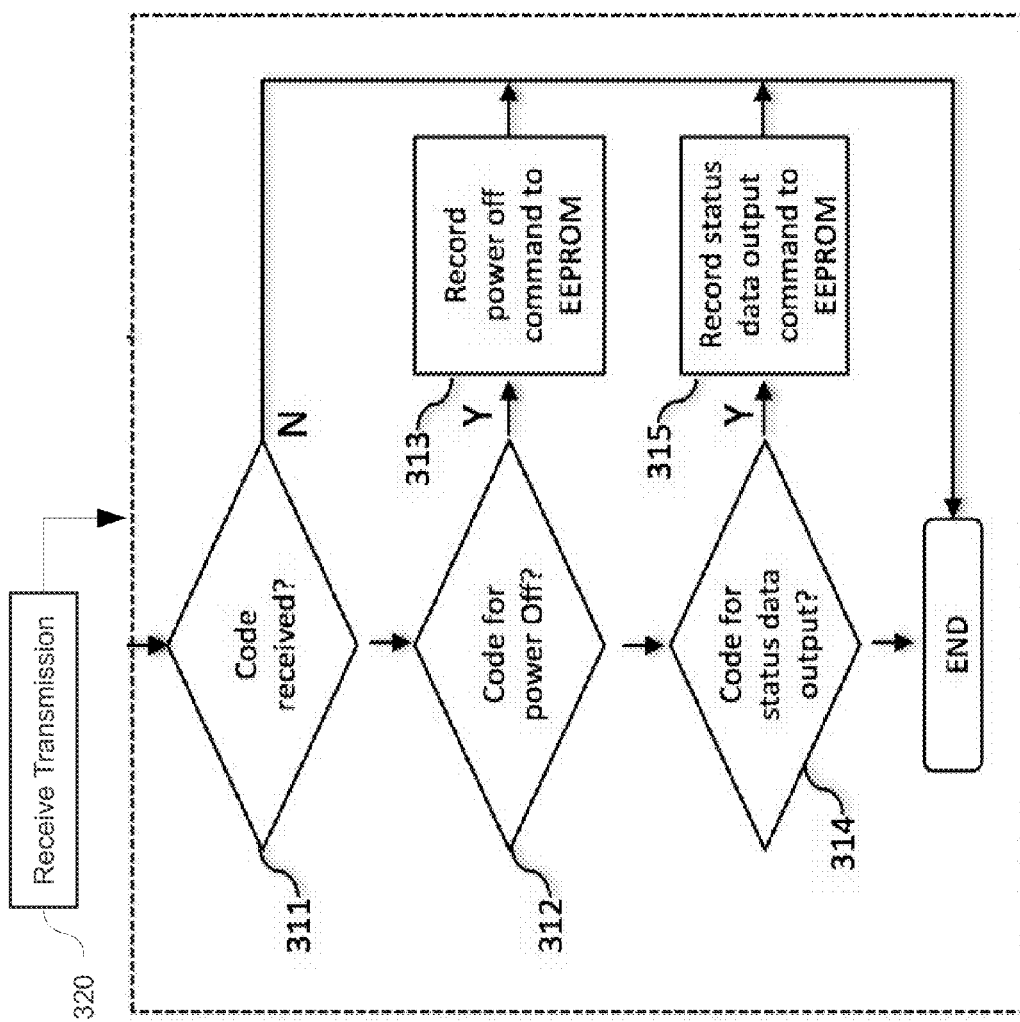
FIG. 4 shows a flow chart of a method of receiving and storing an optical signal by a solar panel, in an embodiment of the disclosed technology.

FIG. 4 shows a flow chart of a method of receiving and storing an optical signal by a solar panel, in an embodiment of the disclosed technology. The steps shown in FIG. 4 are carried out in a low power (defined as insufficient power from solar cells or battery to power the one or more of the communications devices in block 220) or full power state (defined as sufficient power to operate all communications devices in block 220 of FIG. 3). Power states will be discussed further with reference to FIG. 5.

The microprocessor 207 initiates the steps shown in FIG. 4 upon receiving an optical transmission in step 320, which is interpreted as receipt of a code (defined as a message encoded in an optical signal intended for instructions in the coded message to be carried out) in step 311. When the microprocessor 207 receives signal code from the code decoder 206, step 311 is carried out whereby a determination is made that a code that is understood is received. The code may serve to power off the device, for which a determination thereof may be made in step 312, or a request for status data to be outputted, as determined in step 314. Such a code is recorded in step 313 or 315, to an EEPROM or other memory storage device. (In a full power state, it may not be necessary to store to an EEPROM, as the code may be acted on immediately, using volatile memory sending a code to a processor.)

When an operator wants to pair a transmitter with solar module(s), he/she can send a chosen master code by the transmitter 202. Then the transmitter 202 sends a master code write request with given master code. The master code is a required coded identifier needed to pair a solar module 201 and a transmitter 202 (see FIG. 2). That is, the master code must be verified by way of a processor before a command to be carried out is accepted. In this manner, one set of codes can be used for one of many solar panels, as soon as a transmitter sends proper authenticating data in the form of a code needed for a solar panel/receiver and associated devices (as shown in the Figures) to accept instructions and carry out a command from a transmitter. Based on sending a master code, the transmitter becomes paired with the receiving devices. If the incoming code is for a master code write request, the microprocessor 207 writes incoming master code to EEPROM as in steps of 313 or 315. Thereafter, the transmitter sends a control code with such master code every time it communicates with solar module(s), an embodiment of the disclosed technology. In such an embodiment, every time the microprocessor 207 receives a control code, it will read the incoming master code and compare to the master code recorded on EEPROM. If the master codes do not match or if there is no recorded master code on EEPROM, the microprocessor ends the process without executing a command.

Figure 5:
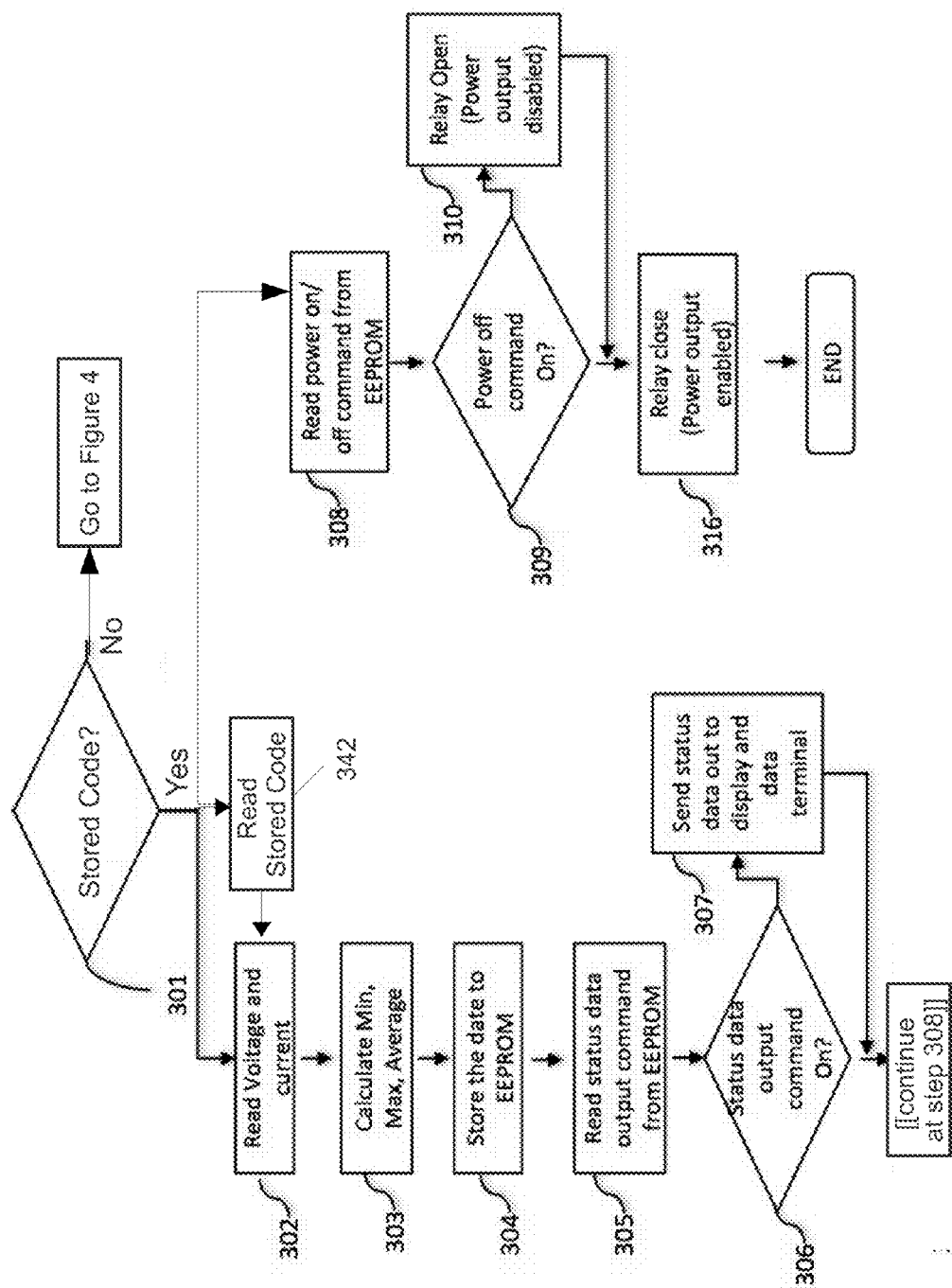
FIG. 5 shows steps carried out upon receipt of an optical signal from a transmitter.

FIG. 5 shows steps carried out upon receipt of an optical signal from a transmitter. In step 301 it is determined if there is a stored code. Such a determination may be made periodically (every processor cycle, every second, or every minute, by way of example), or upon returning from a low power state to a full power state sufficient to operate every device in block 220. This may occur when, for example, the solar module is connected to a power source or obtains more power from the photo-voltaic process (such as when there is more light). The stored code may be in volatile or non-volatile memory. If there is a stored code, it is read in step 342. If not, then the steps to store a code are carried out, as described with reference to FIG. 4. In any case, once a received code is acted upon, any of the steps shown in FIG. 5 may be reported. Such steps, which take place whenever there is sufficient power, and which are stored for later output upon receiving a coded request for same, include reading the current voltage and current output from the photovoltaic cells (step 302), calculating the minimum, maximum, and average voltage or current from steps 302 over a period of time (in step 303), storing a timestamp associated with the data of steps 302 and 303 (in step 304), reading status data (step 305), and so forth.

In step 306, if a code is received indicating that status data output is to be reported, such as to a display or via transmission back to the transmitter, then such status data is displayed in step 307 continuously, for a period of time as pre-designated, or at the instantaneous moment in time that the code is processed. Similarly, in step 308, if the code received indicated that the photovoltaic cells should stop outputting power to the electrical grid or to be stored, then in step 309, this occurs by way of acting on such a power off command. A relay opens in step 310, and power output from the photovoltaic cells is disabled. If the power is already off and such a command is received, then, in step 316, instead, the power output is enabled by way of opening a relay.

Figure 6:
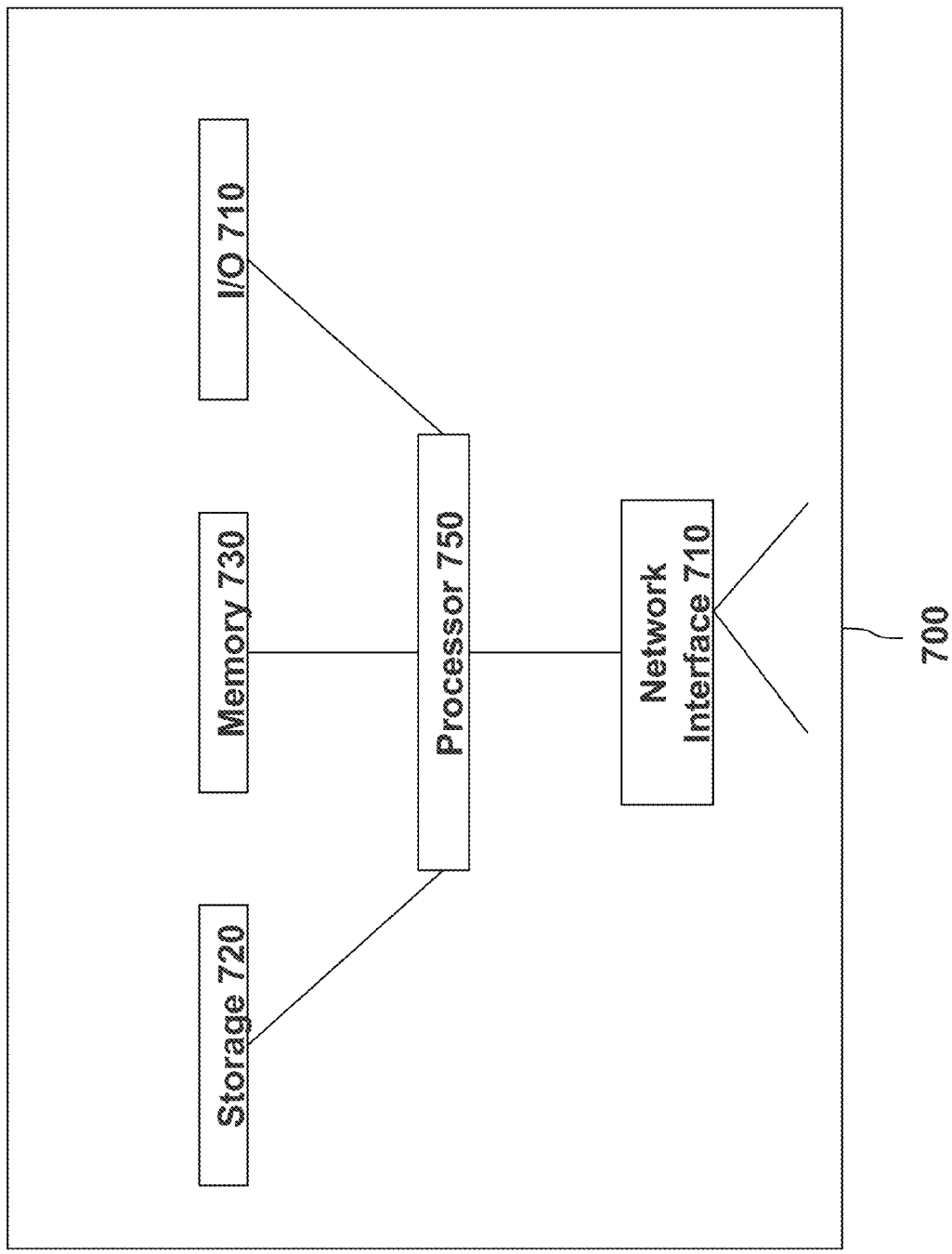
FIG. 6 shows a high-level block diagram of a device that may be used to carry out the disclosed technology.

FIG. 6 shows a high-level block diagram of a device that may be used to carry out the disclosed technology. Device 700 comprises a processor 750 that controls the overall operation of the computer by executing the measurement device's program instructions which define such operation. The measurement device's program instructions may be stored in a storage device 720 (e.g., magnetic disk, flash disk, database) and loaded into memory 730 when execution of the measurement device's program instructions is desired. Thus, the measurement device's operation will be defined by the measurement device's program instructions stored in memory 730 and/or storage 720, and the measurement device will be controlled by processor 750 executing the measurement device's program instructions. A device 700 also includes one or a plurality of input network interfaces for communicating with other devices via a network (e.g., the internet). A device 700 also includes one or more output network interfaces 710 for communicating with other devices. Device 700 also includes input/output 740 representing devices which allow for user interaction with the computer 700 (e.g., display, keyboard, mouse, speakers, buttons, etc.). One skilled in the art will recognize that an implementation of an actual device will contain other components as well, and that FIG. 7 is a high level representation of some of the components of such a measurement device for illustrative purposes. It should also be understood by one skilled in the art that the method and devices depicted in FIGS. 1 through 5 may be implemented on a device such as is shown in FIG. 6.

While the disclosed technology has been taught with specific reference to the above embodiments, a person having ordinary skill in the art will recognize that changes can be made in form and detail without departing from the spirit and the scope of the disclosed technology. The described embodiments are to be considered in all respects only illustrative and not restrictive. All changes that come within the meaning and range of equivalency of the claims are to be embraced within their scope. Combinations of any of the methods, systems, and devices described hereinabove are also contemplated and within the scope of the invention.

We claim:

1. A method of controlling and monitoring solar modules by optical communication comprising steps of:
    transmitting an optical signal from a transmitter;
    receiving said optical signal at at least one solar cell in a solar panel, said solar cell and solar panel concurrently electrically connected to provide electric current to a power sink;
    propagating said received optical signal through busbars electrically engaged with said solar cell and said power sink to a processor; and
    processing said received optical signal to execute a command on said solar panel;
    wherein said processor is powered by a battery, and if said command is received when said solar panel produces electrical current output insufficient for execution of said command, said processor stores said command in non-volatile memory, and said command is executed only when said solar panel produces sufficient electrical current output to execute said command.

2. The method of claim 1, wherein said command is selected from the group consisting of powering on said solar panel, powering off said solar panel, and outputting status information related to said solar panel.

3. The method of claim 1, further comprising steps of:
    recording, at a storage device electrically connected to said solar panel, power output of said solar panel;
    determining, by way of said processor, an average power output over a period of time and storing said average power output to said storage device; and
    outputting stored information from said steps of recording and determining to a display upon receiving a command from said transmitter.

4. The method of claim 1, wherein electric current from said busbars passes through a band pass filter before passing to circuitry adapted to decode said transmitted optical signal.

5. The method of claim 4, wherein a blocking capacitor is placed inline with said band pass filter, said blocking capacitor eliminating DC electric current received from said busbars.

6. An optical transmitter and receiver kit utilizing a method whereby:
    an optical transmitter transmits coded pulses of light;
    a solar panel converts light energy into electrical energy;
    an electrically powered device receives said electrical energy and becomes operational based on said received electrical energy;
    at least one metal conduit transmitting said electrical energy between said solar panel and said electrically powered device;
    a decoder receiving at least part of said electrical energy from said solar panel by way of said metal conduit, detecting said transmitted coded pulses of light, and determining a code comprised in said coded pulses of light;
    wherein a command is carried out by way of a processor receiving data from said decoder, only when said solar panel produces sufficient electrical current output for executing said command and stores the command for later execution when said solar panel lacks sufficient electrical current output for executing said command.

7. The optical transmitter and receiver kit of claim 6, wherein said solar panel receives said transmitted coded pulses of light which is passed through a band pass filter after being converted to electrical energy and before being sent to said decoder.

8. The optical transmitter and receiver kit of claim 7, wherein operation of said electrically powered device for said receipt of said transmitted coded pulses of light and for decoding thereof uses the same flow of current received by said solar panel.

9. The optical transmitter and receiver kit of claim 8, wherein said command is a power off command and said electrically powered device becomes non-operative.

10. The optical transmitter and receiver kit of claim 9, wherein operational is defined as carrying out intended functions which require connection to a power source.

11. The optical transmitter and receiver kit of claim 10, wherein said electrically powered device is a battery and said intended function which requires connection to a power source is charging of the battery.

12. The optical transmitter and receiver kit of claim 10, wherein said electrically powered device is a light and said intended function which requires connection to a power source is emitting photons.

13. The optical transmitter and receiver kit of claim 8, wherein said command is a power on command and said electrically powered device becomes operative.

14. The optical transmitter and receiver kit of claim 8, wherein said command is a status report command, and status information about said solar panel is exhibited on a display.

15. The optical transmitter and receiver kit of claim 6, wherein if said command is received when electrical energy outputted from said solar panel is below a threshold, said command is stored in non-volatile memory until a later time at which electrical output passes above said threshold, and is then executed.

16. The optical transmitter and receiver of claim 15, wherein said threshold is defined as having enough electrical output from said solar panel to operate all control circuitry required to properly execute said command.

17. The optical transmitter and receiver of claim 6, wherein said transmitter sends a master code comprising a required coded identifier needed to pair said transmitter with said solar panel, wherein said coded identifier must be verified by way of said processor before a command to be carried out is accepted.

* * * * *